United States Patent [19]

Hamburgen

[11] Patent Number: 5,150,197
[45] Date of Patent: Sep. 22, 1992

[54] DIE ATTACH STRUCTURE AND METHOD

[75] Inventor: William R. Hamburgen, Menlo Park, Calif.

[73] Assignee: Digital Equipment Corporation, Maynard, Mass.

[21] Appl. No.: 628,944

[22] Filed: Dec. 14, 1990

Related U.S. Application Data

[63] Continuation of Ser. No. 417,730, Oct. 5, 1989, abandoned.

[51] Int. Cl.$^5$ .................... H01L 39/02; H01L 23/02
[52] U.S. Cl. ........................................ 357/80; 357/81
[58] Field of Search .............. 357/80, 68, 55, 74, 357/81, 65; 437/209

[56] References Cited

U.S. PATENT DOCUMENTS

| 3,532,944 | 10/1970 | Ollendorf et al. | 357/81 |
|---|---|---|---|
| 3,821,614 | 4/1974 | Schmidt | 317/234 |
| 4,151,546 | 4/1979 | Kawagai et al. | 357/71 |
| 4,258,382 | 4/1981 | Harris | 357/71 |
| 4,263,606 | 5/1981 | Yorikane | 357/71 |
| 4,413,308 | 11/1983 | Brown | 357/80 |
| 4,434,434 | 2/1984 | Bhattacharya et al. | 357/71 |
| 4,446,912 | 5/1984 | Diehl et al. | 174/94 |
| 4,604,644 | 8/1986 | Beckham et al. | 357/68 |
| 4,649,415 | 3/1987 | Hebert | 357/74 |
| 4,670,770 | 6/1987 | Tai | 357/55 |
| 4,757,934 | 7/1988 | Greenstein | 228/123 |
| 4,903,118 | 2/1990 | Iwade | 357/72 |

FOREIGN PATENT DOCUMENTS

| 54-138370 | 10/1974 | Japan | 357/80 |
|---|---|---|---|
| 57-40965A | 3/1982 | Japan | 357/74 |
| 58-6152A | 1/1983 | Japan | 357/74 |
| 58-204559 | 11/1983 | Japan | 357/81 |
| 60-113954 | 6/1985 | Japan | 357/81 |
| 62-136865 | 6/1987 | Japan | 357/81 |
| 0237534 | 10/1988 | Japan | 357/80 |
| 62065715 | 1/1989 | Japan | 357/74 |

OTHER PUBLICATIONS

Webster's Dictionary pg. 364 ©1984.
IBM Technical Disclosure Bulletin "Microelectronic Devices Standoffs" by Miller vol. 8 No. 3 Aug. 1965.
IBM Technical Disclosure Bulletin vol. 28, No. 6 Nov. 1985, p. 2353 "Solder Pad Improvement".

Primary Examiner—William D. Larkins
Assistant Examiner—Donald L. Monin, Jr.
Attorney, Agent, or Firm—Flehr, Hohbach, Test, Albritton & Herbert

[57] ABSTRACT

Die attach structure and method in which the joint between a die and a substrate is formed in a manner which provides a uniform temperature distribution in the die and reduces stress in the joint near the edge of the die. In some embodiments, the substrate is formed with a non-planar surface in the die attach area, and the joint between the die and the substrate is thicker toward the edge of die than at the center. In other embodiments, different die attach materials are employed to make the joint stiffer toward the center of the die and more flexible toward the edges. In some embodiments, both the thickened joint and the different die attach materials are employed.

10 Claims, 1 Drawing Sheet

DIE ATTACH STRUCTURE AND METHOD

This is a continuation of application Ser. No. 07/417,730 filed Oct. 5, 1989, now abandoned.

This invention pertains generally to semiconductor devices and, more particularly to a structure and method for attaching a semiconductor die to a substrate.

Large, high powered semiconductor chips or dice are commonly mounted on metal or ceramic substrates which serve as heat sinks to carry heat away from the chips or dice. The conventional technique for attaching a die to a substrate involves joining a planar die to a planar substrate with a single material, typically a solder, an adhesive, or a fritted glass. If done properly, this results in a joint of uniform thickness.

One problem with this conventional technique is thermal spreading, or a tendency for the die to be hot near its center and cooler near it edges. This heating can limit the performance of the device and, in sever cases, result in damage to the semiconductor.

Also, because of thermal gradients and a mismatch in coefficients of expansion between the die and the substrate, there is a stress in the joint. The stress is minimal near the center of the die and increases toward near the edges, and it can cause the joint to fail.

Both transfer of heat between the die and the substrate and the level of stress in the joint are dependent upon the thickness of the joint, with a thinner joint providing better heat transfer but higher stress. In the conventional die attach, the thickness of the joint represents a compromise between adequate heat transfer and an acceptable level of stress. This is difficult to realize in practice, particularly with large, high powered chips.

The invention provides an improved die attach structure and method in which the joint between the die and the substrate is formed in a manner which provides a more uniform temperature distribution in the die and reduces stress in the joint near the edge of the die. In some embodiments, the substrate is formed with a non-planar surface in the die attach area, and the joint between the die and the substrate is thicker toward the edge of die than at the center. In other embodiments, different die attach materials are employed to make the joint stiffer toward the center of the die and more flexible toward the edges. In some embodiments, both the thickened joint and the different die attach materials are employed.

Figure 1:
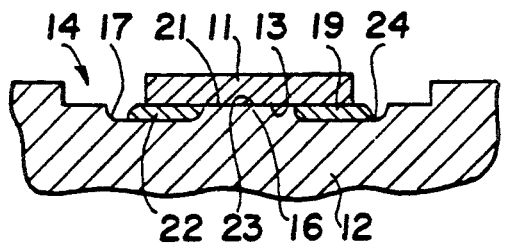
FIG. 1 is an enlarged fragmentary sectional view of one embodiment of a die attach structure according to the invention.

In FIG. 1, the invention is illustrated in connection with a generally rectangular semiconductor die 11 and a generally planar substrate 12. The die has a planar lower surface 13, and the substrate has a die attach area 14 in which the die is received. The die attach area has a raised central portion 16 and a recessed outer portion 17, with the central portion of the die being positioned above the raised central portion of the die attach area and the edges of the die being positioned above the recessed portion of the area. The die is bonded to the substrate by a die attach material 19 which fills the region between the lower surface of the die and the surface of the substrate in the die attach area, with a relatively thin joint 21 thus being formed beneath the central portion of the die and a thicker joint 22 being formed beneath the edge portions.

The raised portion of the die attach area has a planar surface 23, and the recessed portion of the area has a planar surface 24 which is positioned somewhat below the surface of the raised area. The lower surface of the die is parallel to these surfaces.

The thinner joint at the center of the die provides better heat transfer between the die and the substrate in that area and results in a more uniform temperature across the die. The thicker joint toward the edges of the die reduces stresses near the edges, although it may make the temperature of the die somewhat higher at the edges than it would be with a thinner joint. The higher edge temperature is not a problem, however, and the peak die temperature is actually reduced because of the thinner joint at the center.

Figure 2:
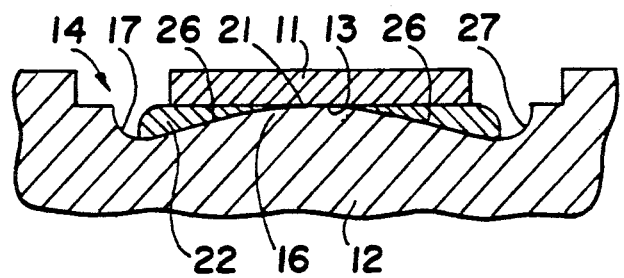
FIGS. 2-4 are views similar to FIG. 1 of additional embodiments of a die attach structure according to the invention.

The embodiment of FIG. 2 is generally similar to the embodiment of FIG. 1, and like reference numerals designate corresponding elements in the two embodiments. In the embodiment of FIG. 2, however, the edges 26 of the raised central portion of the die attach area are relieved or rounded, and the recessed portion of the area is formed with a concave surface 27. This contouring of the surfaces permits optimization of the temperature and/or stress distribution across the die.

Figure 3:
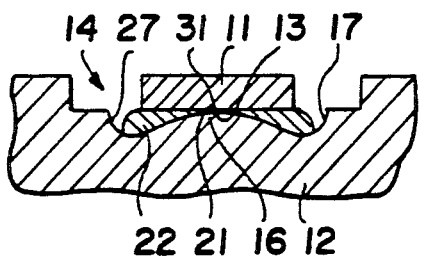

In the embodiment of FIG. 3, the upper surface 31 of the central portion of the die attach area has a convex curvature, and the recessed portion has a concave curvature as in the embodiment of FIG. 2. This contouring of the surfaces permits optimization of the temperature and/or stress distribution over the entire surface of the die.

Figure 4:
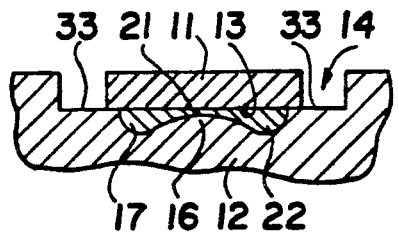

The embodiment of FIG. 4 is generally similar to the embodiment of FIG. 3, and like reference numerals once again designate corresponding elements. In this embodiment, however, the edge portions of the die extend beyond the recessed portion of the attach area, and the die is supported by the floor 33 of the attach area. This eliminates the need for a fixture or tooling to hold the die in a level position during assembly, but it does introduce a high stress concentration at the edges of the die. To avoid breakage of the die, the adhesive employed in this embodiment is selected to fail before the edge portions of the die break.

If desired, the thicker and thinner joints can be formed by configuring the lower surface of the die with a non-planar surface rather than forming the contoured mounting surface in the die attach area of the substrate. Likewise, the die and the substrate can both be formed with non-planar or contoured surfaces.

The die attach material which bonds the die to the substrate can be any suitable material for this purpose. Such materials include solder, filled organic adhesives, glass/metal frits, and the like.

Improved temperature distribution and stress relief can also be provided by using different die attach materials for different portions of the die. Thus, for example, a relatively strong, stiff material can be employed in the central region where stress is minimal, with a weaker, more flexible material toward the edges where stress is greater. The material employed in the center preferably has a high thermal conductivity, and the material employed at the edges can have a lower thermal conductivity. Suitable materials include a high strength silver or diamond filled epoxy for the central region, and a modified low-modulus epoxy or a thermoplastic material for the outer region. As will be apparent to those familiar with the art, these are just a few examples of the numerous materials which can be used as the die attach materials.

When different materials are used for the central region and the outer region, it is not necessary to employ different joint thicknesses in the two regions, and the surfaces of both the die and the substrate can be planar. However, it is also possible to combine the two approaches and use a relatively strong, stiff material in for the thinner joint in the central region and a weaker, more flexible material for the thicker joint in the outer region.

The invention has a number of important features and advantages. It improves the joint between a die and a substrate and provides greater tolerance to mechanical stresses in the joint while providing good heat transfer across the joint. Making the joint thicker near the edge of the die than it is near the center reduces stresses near the edge of the die and allows greater heat transfer at the center. The use of a stronger, more thermally conductive die attach material at the center of the joint and a weaker, more flexible material toward the edges can also permit greater heat transfer toward the center and greater tolerance to stresses near the edges. Combining the tapered joint with different attach materials in different regions provides an even greater degree of control over temperature and stress distribution.

It is apparent from the foregoing that a new and improved die attach structure and method have been provided. While only certain presently preferred embodiments have been described in detail, as will be apparent to those familiar with the art, certain changes and modifications can be made without departing from the scope of the invention as defined by the following claims.

I claim:

1. In a semiconductor device: a substrate having a die attach area with a mounting surface, a semiconductor die having a surface facing the mounting surface, one of said surfaces being contoured in such manner that a central portion of the die is closer to the substrate than an edge portion, a first die attach material filling the region between the central portion of the die and the substrate and providing good heat transfer between the central portion of the die and the substrate, and a second die attach material comprising a different material than the first die attach material filling the region between the edge portion of the die and the substrate and bonding the edge portion to the substrate.

2. The device of claim 1 wherein the die attache area has a raised central portion and a recessed outer portion with surfaces which form the mounting surface.

3. The device of claim 1 wherein the first die attach material is stiffer than the second die attach material.

4. The device of claim 1 wherein the first die attach material has a higher thermal conductivity than the second die attach material.

5. The semiconductor device of claim 1 wherein the substrate is of substantially greater lateral extend and thermal mass than the die, and the die attach area is formed integrally with the substrate as a part thereof.

6. The device of claim 5 wherein the die attach area has a raised central portion and a recessed outer portion with surfaces which form the mounting surface.

7. The device of claim 6 wherein the surfaces of the central and outer portions of the die attach area are both generally planar.

8. The device of claim 6 wherein the surface of the outer portion of the die attache area is concave.

9. The device of claim 6 wherein the surface of the central portion of the die attach area is planar toward its middle and rounded toward its periphery.

10. The device of claim 6 wherein the surface of the central portion of the die attach area is convex.

* * * * *